US010487557B2

(12) United States Patent
MacArthur et al.

(10) Patent No.: US 10,487,557 B2
(45) Date of Patent: Nov. 26, 2019

(54) MEASUREMENT SYSTEMS AND METHODS FOR VEHICLE WINDOW ASSEMBLIES

(71) Applicant: Honda Motor Co., Ltd., Tokyo (JP)

(72) Inventors: Benjamin MacArthur, Barrie (CA); Jake Holloway, Mississauga (CA)

(73) Assignee: Honda Motor Co., Ltd., Tokyo (JP)

( * ) Notice: Subject to any disclaimer, the term of this patent is extended or adjusted under 35 U.S.C. 154(b) by 315 days.

(21) Appl. No.: 15/462,351

(22) Filed: Mar. 17, 2017

(65) Prior Publication Data

US 2018/0267105 A1 Sep. 20, 2018

(51) Int. Cl.
*E05F 7/00* (2006.01)
*G01R 31/34* (2006.01)

(52) U.S. Cl.
CPC .................................... *E05F 7/00* (2013.01)

(58) Field of Classification Search
CPC .................................................... G01R 31/34
USPC ................................................ 318/466, 445
See application file for complete search history.

(56) References Cited

U.S. PATENT DOCUMENTS 4,444,344 A * 4/1984 Marcus .................... B60R 7/10 224/313
5,627,767 A 5/1997 Gabiniewicz
6,043,620 A * 3/2000 Koestler .............. H02H 7/0851 318/266
6,236,176 B1 * 5/2001 Uebelein .............. H02H 7/0851 318/280
8,117,002 B2 2/2012 Venaelaeinen
9,285,203 B1 3/2016 Mermoud et al.
9,567,790 B2 * 2/2017 Yamada ................ E05F 15/659
2004/0035013 A1 2/2004 Cummings

FOREIGN PATENT DOCUMENTS

CN 104897389 A 9/2015
DE 102004007137 A1 6/2005
DE 102007060820 A1 6/2009
EP 2610579 B1 9/2015
KR 100194867 B1 2/1999
KR 100341766 B1 6/2002

* cited by examiner

*Primary Examiner* — David Luo
(74) *Attorney, Agent, or Firm* — Armstrong Teasdale LLP

(57) ABSTRACT

An apparatus for measuring operational characteristics of a motorized window assembly of a vehicle door panel includes a support frame, a first sensor connected to the frame, a second sensor, and a third sensor connected to the frame. The first sensor is configured to measure displacement of a window of the window assembly, the second sensor is configured to connect between a motor of the window assembly and a power supply to measure an amount of current supplied to the motor, and the third sensor is configured to measure a force applied to the window by the motor. The support frame includes a first fastening device for coupling the frame to the door panel, and a second fastening device for coupling to an upper portion of a window frame of the door panel. The support frame is removably coupleable to the door panel via said first and second fastening devices.

20 Claims, 10 Drawing Sheets

800

900

MEASUREMENT SYSTEMS AND METHODS FOR VEHICLE WINDOW ASSEMBLIES

BACKGROUND

The present disclosure relates generally to window assemblies for vehicles and, more specifically, to measurement systems for use in measuring operational characteristics of motorized window assemblies.

During manufacturing and assembly of vehicles, various components and subsystems are tested to collect data on the operational characteristics of the components and subsystems. Often, the operational characteristics are quantifiable measurements associated with the measured component or subsystem, such as force, electrical current magnitude, and the like. The data collected is used to identify abnormalities of the measured component or subsystem, such as defectives or misaligned components of assemblies. However, to collect the data, it is often necessary to perform multiple measurements using different measurement machines. Such a process may be time-consuming and may slow down the manufacturing process. For example, subsystems such as motorized window assemblies have multiple operational characteristics that each require different types of measurement, such as force, displacement, and current.

BRIEF SUMMARY

In one aspect, an apparatus for measuring operational characteristics of a motorized window assembly of a vehicle door panel is provided. The apparatus includes a support frame, a first sensor connected to the frame, a second sensor configured to be electrically connected between a motor of the window assembly and a power supply, and a third sensor connected to the frame. The first sensor is configured to measure displacement of a window of the window assembly, the second sensor is configured to measure an amount of current supplied to the motor, and the third sensor is configured to measure a force applied to the window by the motor. The support frame includes a first fastening device for coupling the frame to the door panel, and a second fastening device for coupling to an upper portion of a window frame of the door panel. The support frame is removably connectable to the door panel via said first and second fastening devices.

In another aspect, a measurement system for measuring operational characteristics of a motorized window assembly of a vehicle door panel is provided. The system includes a computing device and a measurement apparatus that includes a support frame and a plurality of sensors communicatively connected to the computing device. The plurality of sensors includes a first sensor connected to the frame and configured to measure displacement of a window of the window assembly, a second sensor configured to measure an amount of current supplied to a motor of the window assembly, and a third sensor connected to the frame and configured to measure a force applied to the window by the motor. The support frame includes a first fastening device for coupling the frame to the door panel, and a second fastening device for coupling to an upper portion of a window frame of the door panel. The support frame is removably connectable to the door panel via said first and second fastening devices.

In yet another aspect, a method is provided. The method includes positioning a measurement apparatus adjacent to a door panel that includes a motorized window assembly and a window frame. The measurement apparatus includes a support frame, a first sensor connected to the support frame and configured to measure displacement of a window of the window assembly, a second sensor configured to measure an amount of current supplied to a motor of the window assembly, and a third sensor connected to the support frame and configured to measure a force applied to the window by the motor. The method further includes connecting the support frame to the door panel by connecting a first fastening device of the support frame to the door panel and connecting a second fastening device of the support frame to an upper portion of the window frame.

DETAILED DESCRIPTION

The embodiments described herein relate generally to window assemblies for vehicles and, more specifically, to measurement systems for use with motorized window assemblies of a vehicle. As described further herein, embodiments of measurement systems described herein facilitate reducing measurement time for measuring operational characteristics of motorized window assemblies. Moreover, measurement systems of the present disclosure facilitate improved identification of abnormalities in window assemblies, and as such reduce the number of defective, uncalibrated, misaligned, and/or otherwise malfunctioning parts associated with motorized window assemblies used with assembled vehicles.

Figure 1:
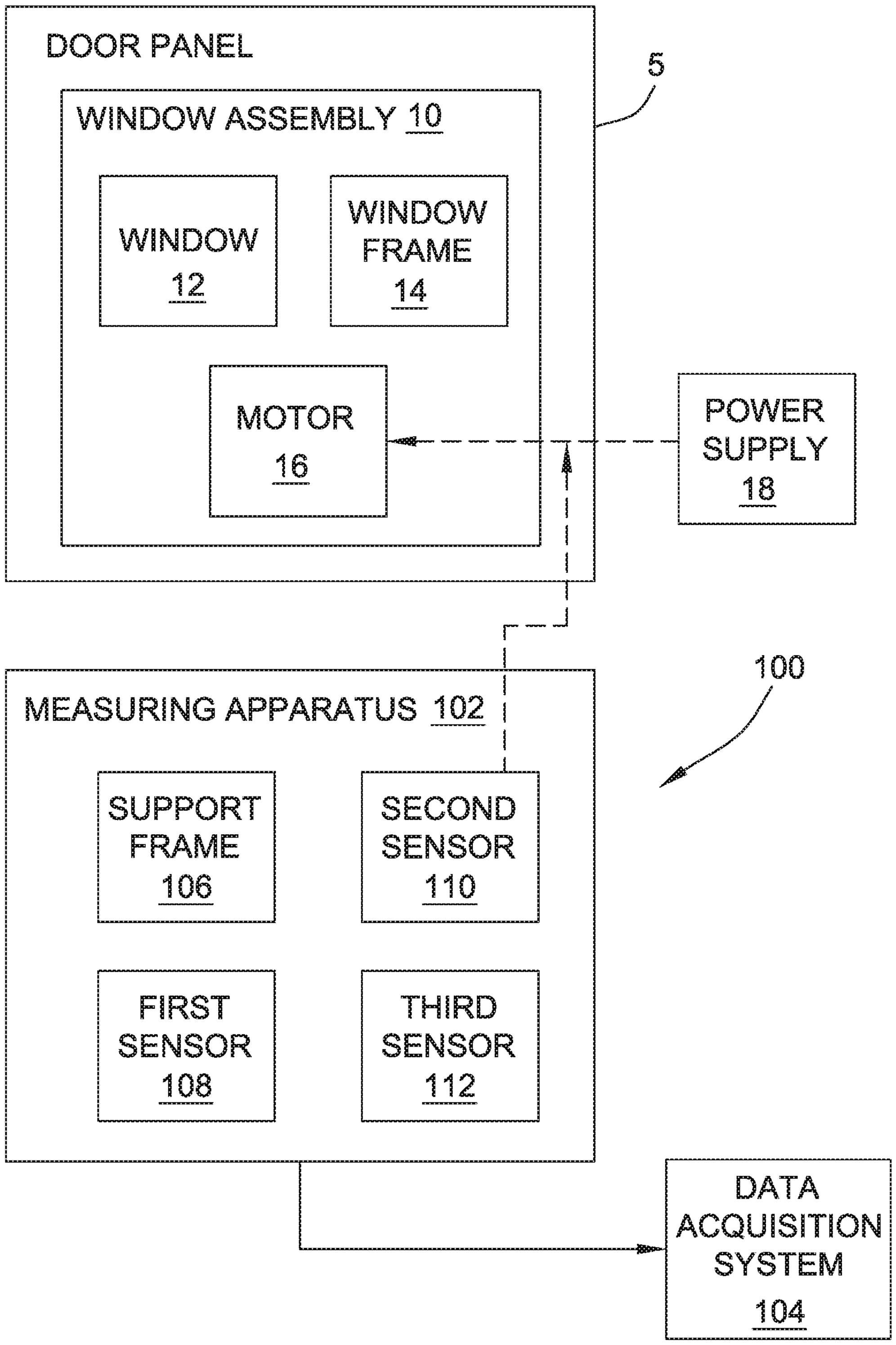
FIG. 1 is a block diagram of an exemplary measurement system that may be used with a motorized window assembly.

FIG. 1 is a block diagram of an exemplary measurement system 100 for use with a motorized window assembly 10 of a vehicle. In the exemplary embodiment, window assembly 10 is part of a door panel 5 and includes a window glass 12 (generally, a "window"), a window frame 14, and a motor 16. In other embodiments, window assembly 10 may include, additional, fewer or alternative components.

Window 12 is a panel of transparent material (e.g., glass) that is selectively movable relative to window frame 14. In particular, window 12 is movable between a closed position, in which window 12 extends over and substantially covers a window opening (not shown in FIG. 1) defined by window frame 14, and an open position in which window 12 does not extend over the window opening. In some embodiments, window 12 may extend over a portion of or partially cover the window opening when in the open position. Window 12 is positioned on a track (not shown) that facilitates movement of window 12 between the closed and open positions.

In at least one embodiment, motor 16 is installed within door panel 5. Motor 16 is an electrical motor that is operable to move window 12 between the closed and open positions. More specifically, motor 16 receives electrical power from a power supply 18 and actuates at least one mechanism that selectively extends window 12 to the closed position or retracts window 12 to the open position. As used herein, "upstroke" refers to the motion of window 12 from the open position to the closed position and "downstroke" refers to the motion of window 12 from the closed position to the open position. When the vehicle is assembled, power supply 18 is a battery installed in the vehicle. During assembly of the vehicle and door panel 5, power supply 18 may be an external power supply that is electrically coupled to motor 16 for testing. The current supplied by power supply 18 to motor 16 is variable such that increased loads on motor 16 cause an increased amount of current to be supplied to motor 16. Motor 16 also receives at least one control signal that indicates a direction to move window 12 (i.e., toward the open position or the closed position).

Measurement system 100 is a subsystem of a manufacturing system. More specifically, measurement system 100 is a subsystem of an automotive assembly line for assembling vehicles. Measurement system 100 is used to measure operational characteristics associated with window assembly 10 for a plurality of door panels 5. As used herein, an "operational characteristic" is defined as a quantifiable metric associated with the operation of a component or subsystem, such as an amount of force generated, torque, displacement, electrical current generated, and the like. That is, measurement system 100 is used to test the operation of window assembly 10 to collect data for the measured operational characteristics. System 100 thereby facilitates identifying operating abnormalities associated with window assembly 10 based on the collected data. Such abnormalities may indicate, for example, defective parts, uncalibrated parts, parts requiring additional assembly, and/or assembly errors associated with window assembly 10 and/or door panel 5, such as, misalignment. In at least some embodiments, the collected data for different operational characteristics may be synchronized with respect to time to identify abnormalities based on the relationships between the operational characteristics at a particular time.

In the exemplary embodiment, system 100 includes a measurement apparatus 102 and a data acquisition system 104 that is communicatively coupled to measurement apparatus 102. In other embodiments, system 100 includes a plurality of measurement apparatus (including measurement apparatus 102). Measurement apparatus 102 collects measurement data from window assembly 10 associated with one or more operational characteristics, and transmits the collected measurement data to data acquisition system 104. Data acquisition system 104 includes one or more computing devices that process and compile the transmitted measurement data to facilitate identifying potential abnormalities associated with window assembly 10 and door panel 5. In some embodiments, data acquisition system 104 automatically analyzes the data to identify abnormalities associated with window assembly 10 and door panel 5. In other embodiments, data acquisition system 104 outputs and/or displays the data (e.g., on a display device or screen) in a format that facilitates comparison of the different operational characteristics to facilitate identification of abnormalities by a user.

Measurement apparatus 102 includes a support frame 106 that is selectively coupleable to door panel 5 to secure measurement apparatus 102 in place during measurement. In at least some embodiments, support frame 106 is constructed from a relatively lightweight material, such as, for example and without limitation, aluminum. In the exemplary embodiment, support frame 106 includes one or more fastening devices (not shown in FIG. 1) that are coupled to door panel 5 during measurements. In one example, support frame 106 includes one fastening device for coupling support frame 106 to door panel 5, and a second fastening device for coupling support frame 106 to an upper portion of window frame 14. The fastening devices may include, but are not limited to, hooks, pins, magnets, bolts, screws, latches, and/or grooves that secure support frame 106 to door panel 5.

Measurement apparatus 102 also includes at least one sensor for use in collecting the measurement data associated with one or more operational characteristics of window assembly 10. In the exemplary embodiment, measurement apparatus 102 includes a first sensor 108, a second sensor 110, and a third sensor 112. In other embodiments, measurement apparatus 102 may include any other number of sensors. In at least some embodiments, at least one sensor 108, 110, and/or 112 is not coupled to support frame 106. Each sensor 108, 110, and 112 collects measurement data for a different operational characteristic of window assembly 10. For example, first sensor 108 measures linear or vertical displacement of window 12, second sensor 110 measures electrical current supplied to motor 16 by power supply 18, and third sensor 112 measures a force applied to window 12 by motor 16. In the exemplary embodiment, first sensor 108 and third sensor 112 are coupled to support frame 106 to measure displacement data and force data, and second sensor 110 is electrically coupled between motor 16 and power supply 18. Alternatively, sensors 108, 110, and 112 may measure a different combination of operational characteristics.

After the measurement data is collected by sensors 108, 110, and 112, the measurement data is transmitted to data acquisition system 104. Data acquisition system 104 stores the transmitted measurement data for analysis. The measurement data may be transmitted to data acquisition system 104 continuously, asynchronously, or periodically. In one embodiment, data acquisition system 104 automatically analyzes the transmitted measurement data for any potential abnormalities. In another embodiment, data acquisition system 104 displays the transmitted measurement data on a display device or screen to enable a user to review and analyze the measurement data and identify potential abnormalities. In some embodiments, the measurement data from sensors 108, 110, and 112 are displayed on a common graph with reference to a time scale such that abnormalities can be identified based on the relationship of the measurement data from different sensors at a particular time. For example, if motor 16 is defective or uncalibrated, the current data may be relatively high while the force data is relatively low for a period of time, while the displacement data is relatively unaffected. In another example, a sharp increase in current and displacement data at a particular time may indicate window 12 is misaligned or a component is blocking the path of window 12 (e.g., a dent in door panel 5).

Figure 2:
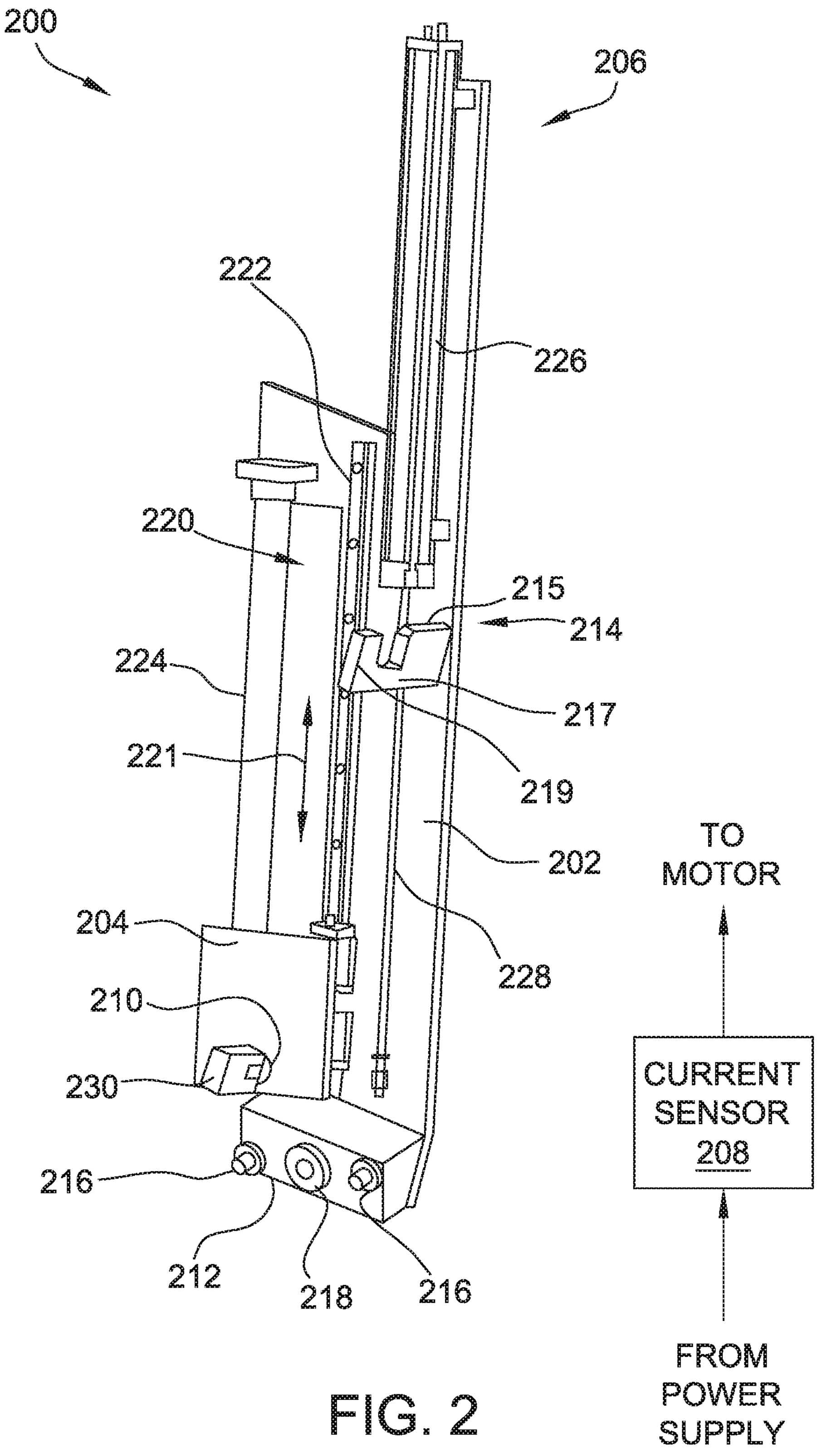
FIG. 2 is a perspective view of an exemplary measurement apparatus that may be used with the measurement system shown in FIG. 1.

FIG. 2 is a perspective view of an exemplary measurement apparatus 200 that may be used with the measurement system 100 (shown in FIG. 1). In the exemplary embodiment, measurement apparatus 200 includes a support frame 202, a support plate 204, a displacement sensor 206, a current sensor 208, and a load cell 210. In other embodiments, apparatus 200 may include additional, fewer, or alternative components, including those described elsewhere herein.

In the exemplary embodiment, support frame 202 is constructed at least partially from aluminum. In other embodiments, support frame 202 is constructed from a different material. Support frame 202 includes a first fastening device 212 and a second fastening device 214 that securely couple to a door panel during measurements described herein. In the exemplary embodiment, first fastening device 212 is coupled to the door panel and second fastening device 214 is coupled to the window frame of the door panel. In other embodiments, fastening devices 212 and 214 are coupled to different portions of the door panel and the window assembly.

In the exemplary embodiment, first fastening device 212 includes two connectors 216 and a magnet 218 used to facilitate coupling between the door panel and support frame 202. More specifically, connectors 216 are spring-loaded dowels that are sized and shaped to be received within corresponding openings defined in the door panel. In other embodiments, connectors 216 are other suitable components for use in coupling support frame 202 to the door panel, such as, but not limited to, hooks, pins, arms, and/or screws. In certain embodiments, the openings defined on the door panel are fastener openings used to secure other components to the door panel. In one example, the openings are sized and oriented to receive fasteners (e.g., bolts, screws, etc.) used to couple an outer liner to the door panel. In such embodiments, connectors 216 are positioned on support frame 202 to align with the openings on the door panel. Magnet 218 magnetically couples to the door panel to facilitate securing the position of support frame 202 relative to the door panel. In some embodiments, magnet 218 is a permanent magnet. In other embodiments, magnet 218 may be an electromagnet that is selectively magnetized as electrical current is induced on magnet 218.

Second fastening device 214, in the exemplary embodiment, is an arm that extends away from support frame 202 and that is coupleable to a window frame at an upper portion of a window opening defined by the window frame. In the exemplary embodiment, second fastening device 214 includes a hook 215 formed at distal end of the arm. Hook 215 includes a base 217 and a leg 219 that extends upwardly from base 217 to define a substantially U-shaped notch. Base 217 supports the window frame along a lower surface of the window frame. That is, second fastening device 214 hooks underneath a top or upper portion of the window frame. Further, in the exemplary embodiment, second fastening device 214 is removably coupled to support frame 202 such that second fastening device 214 is interchangeable with other fastening devices to accommodate different configurations of door panels (e.g., window frames having different sizes and/or shapes). In other embodiments, second fastening device 214 is coupled to the window frame in a different configuration. For example, in one embodiment, second fastening device 214 includes two arms that couple to the window frame.

Support plate 204 is slidably coupled to support frame 202. In the exemplary embodiment, support plate 204 is moveable to facilitate linear displacement relative to frame 202 in a longitudinal or vertical direction, indicated by arrow 221 in FIG. 2. More specifically, support plate 204 is moveable to faciltate linear displacement relative to frame 202 in response to linear displacement of the window. Support plate 204 is coupled to displacement sensor 206 and/or load cell 210 to facilitate collection of measurement data as described herein. In at least some embodiments, support plate 204 is at least partially positioned within an elongate slot 220 defined by support frame 202. Support frame 202 further includes a linear bearing 222 and/or a support member 224 that are coupled to support plate 204. More specifically, support plate 204 is slidably coupled to linear bearing 222 and support member 224 to maintain the orientation of support plate 204 relative to support frame 202 and to facilitate linear movement of support plate 204. In the exemplary embodiment, support member 224 is a rod. In some embodiments, support member 224 is a low-friction air cylinder.

Displacement sensor 206 collects measurement data associated with a displacement of the window during measurement. In particular, during a measurement process, the window is moved between the open position and the closed position. Displacement sensor 206 determines the displacement of the window over time relative to a starting position of the window or another position. In the exemplary embodiment, displacement sensor 206 includes a cylindrical housing 226 and an elongate rod 228 that extends from housing 226. Rod 228 is operatively coupled to support plate 204 and is configured to reciprocate into and out of housing 226 in response to linear displacement of the window and support plate 204. The measurement data collected from displacement sensor 206 is based on the movement of rod 228 relative to housing 226. More specifically, in the exemplary embodiment, displacement sensor 206 is a linear variable differential transformer that includes one or more electrical windings within housing 226, and a magnetic core coupled to rod 228. As rod 228 moves in response to displacement of the window, the core coupled to rod 228 moves relative to the electrical windings, producing a change in voltage across the electrical windings. Displacement sensor 206 outputs the voltage to a data acquisition system (e.g., data acquisition system 104), which converts changes in voltage to a displacement of window glass. In other embodiments, displacement sensor 206 may have a different configuration to measure displacement of the window glass.

Current sensor 208 is electrically coupled between a power supply and a motor of the window assembly. In the exemplary embodiment, current sensor 208 is separate from support frame 204. In other embodiments, current sensor 208 is coupled to support frame 204. In the exemplary embodiment, current sensor 208 is an electrical current shunt for measuring current supplied to the motor. In other embodiments, current sensor 208 is a different type of sensor for measuring current, such as a Hall effect sensor.

Load cell 210 is coupled to support plate 204 and is configured to measure force (e.g., in Newtons) on the window glass. In particular, load cell 210 is configured to measure the force applied to the window glass by the motor. In the exemplary embodiment, load cell 210 includes an engagement member 230 that extends away from support frame 202. Engagement member 230 engages a top edge of the window glass to enable load cell 210 to measure the applied force. In at least some embodiments, engagement member 230 is rotatable relative to support plate 204 to facilitate engagement to different window and/or door panel configurations. Load cell 210 measures the force applied to the window glass through engagement member 230 during the upstroke of the window glass. In other embodiments, load cell 210 engages the window glass in a different configuration to measure force. In further embodiments, apparatus 200 includes a different type of sensor for measuring force.

Figure 3:
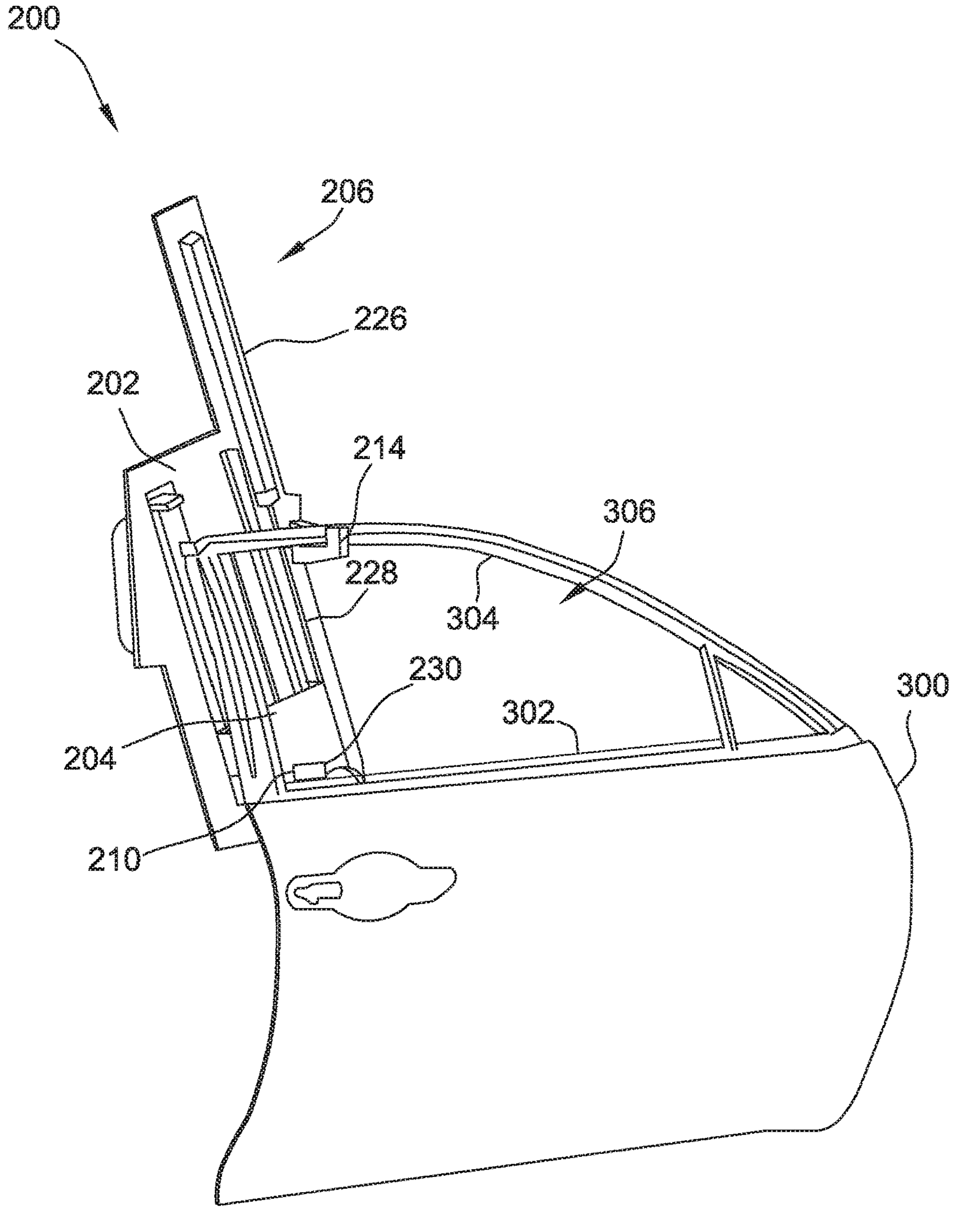
FIG. 3 is a perspective view of the measurement apparatus shown in FIG. 2 with a window of an exemplary door panel positioned in a substantially open position.
Figure 4:
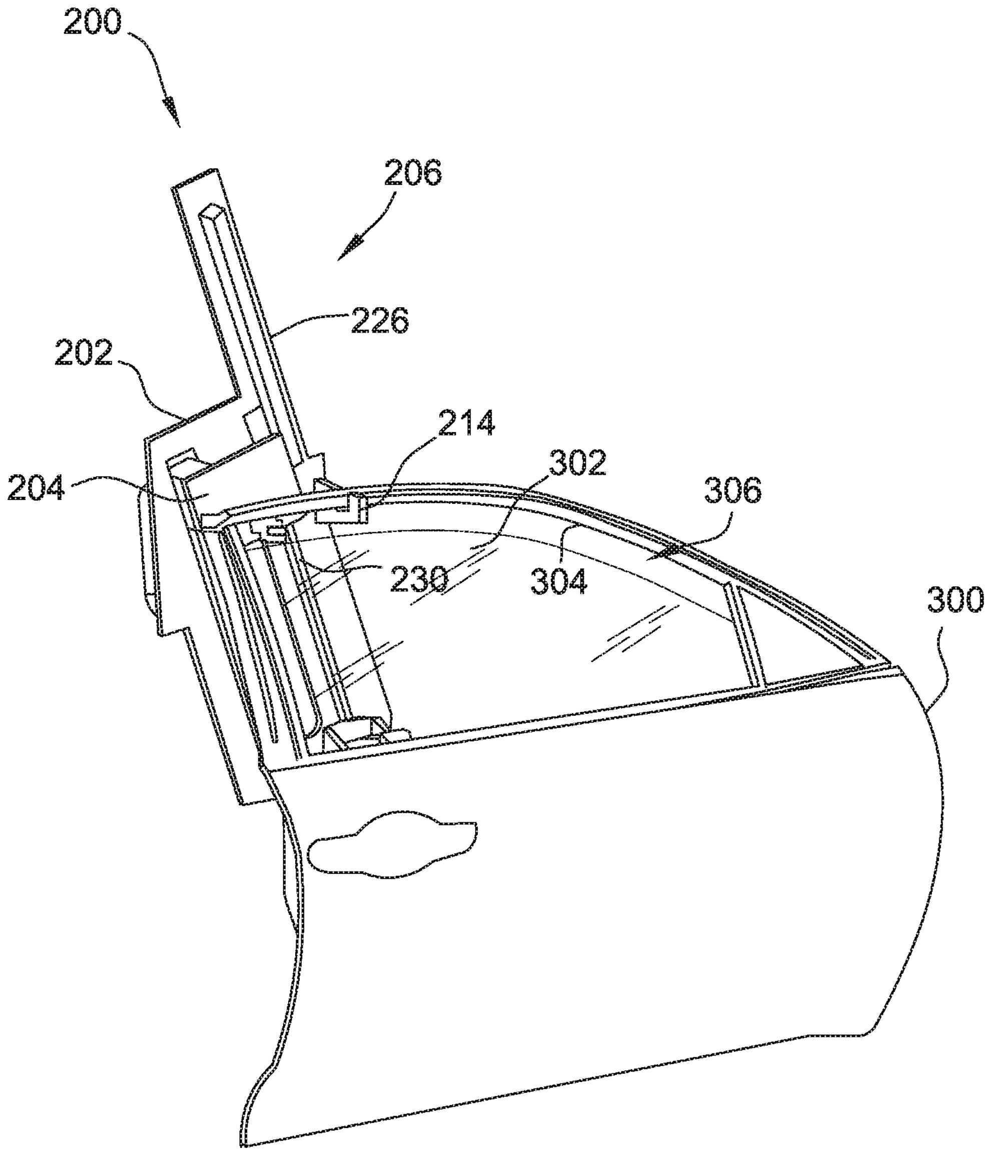
FIG. 4 is a perspective view of the measurement apparatus shown in FIG. 2 with the window of the door panel shown in FIG. 3 positioned in a substantially closed position.

FIGS. 3 and 4 are perspective views of measurement apparatus 200 coupled to a door panel 300 including a motorized window assembly including a motor and a window glass, such as window assembly 10. More specifically, FIG. 3 is a perspective view of measurement apparatus 200 when a window glass 302 (shown in FIG. 4) of door panel 300 is in a substantially open position, and FIG. 4 is a perspective view of measurement apparatus 200 when window glass 302 is in a substantially closed position. That is, during the upstroke of window glass 302, window glass 302 travels from the position shown in FIG. 3 to the position shown in FIG. 4. Door panel 300 further includes a window frame 304 that defines a window opening 306.

During testing and measurement, first fastening device 212 (shown in FIG. 2) and second fastening device 214 are coupled to door panel 300. In particular, first fastening device 212 is coupled to door panel 300 and second fastening device 214 is coupled to an upper portion of window frame 304. Engagement member 230 is positioned within window opening 306 to engage a top edge of window glass 302. When window glass 302 is in the open position, the top edge of window 302 is adjacent a bottom portion of window frame 304, and rod 228 is substantially extended from housing 226. A power supply is coupled through current sensor 208 (shown in FIG. 2) to a motor (not shown) of the window assembly to provide power to the motor. The motor is then activated to cause window glass 302 to travel towards the closed position. Engagement member 230, support plate 204, load cell 210, and rod 228 move based on the movement of window 302. More specifically, the top edge of window glass 302 engages engagement member 230 of load cell 210, and moves the load cell 210 upwards towards the upper portion of window frame 304. As load cell 210 moves upward, support plate 204 moves upward with load cell 210, and rod 228 moves with support plate 204. When window 302 reaches the closed position, engagement member 230 is positioned between the top edge of window glass 302 and the upper portion of window frame 304, and rod 228 is at least partially retracted into housing 226.

While window 302 is moving, measurement data is collected by displacement sensor 206, current sensor 208, and load cell 210. The measurement data is collected simultaneously over time to facilitate identifying abnormalities associated with window 302 based on the relationship of the displacement data, current data, and force data at a particular time. Once the measurement data is collected, measurement apparatus 200 is disengaged or decoupled from door panel 300. In the exemplary embodiment, first fastening device 212 is disengaged from door panel 300 (e.g., by removing connectors 216 from fastener openings and/or decoupling magnet 218 from door panel 300), second fastening device 214 is disengaged from window frame 304 (e.g., by unhooking hook 215 from the upper portion of window frame 304), and engagement member 230 is disengaged from window 302. Door panel 300 proceeds to another station within the automotive assembly line for further assembly and/or to address any identified abnormalities from the collected measurement data. Further, measurement apparatus 200 may be coupled to another door panel on the automotive assembly line to collect measurement data on operational characteristics of the door panel to identify abnormalities of the door panel.

Figure 5A:
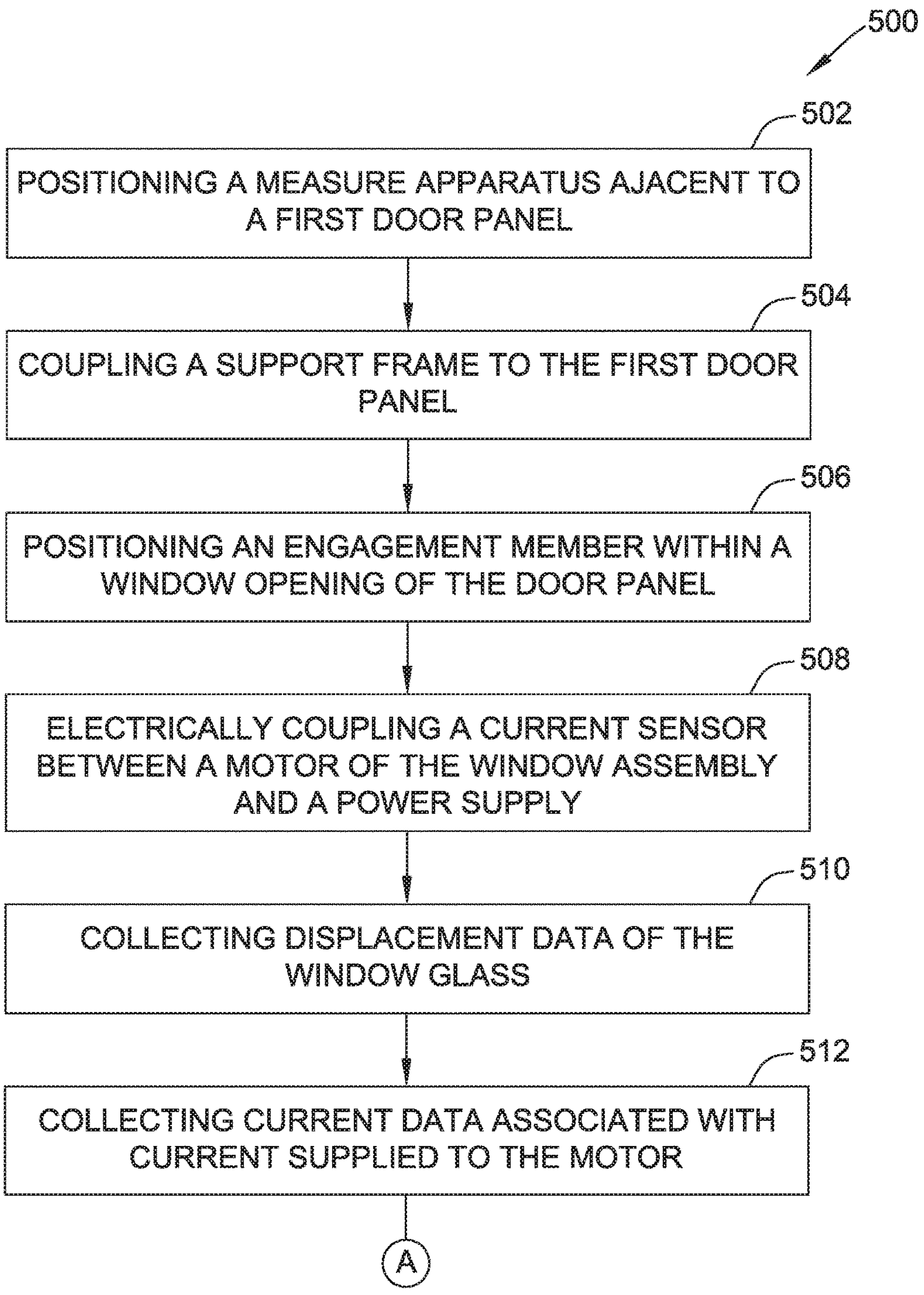
FIG. 5A is a flow diagram of an exemplary method of measuring operational characteristics of a motorized window assembly that may be performed using the measurement system shown in FIG. 1.
Figure 5B:
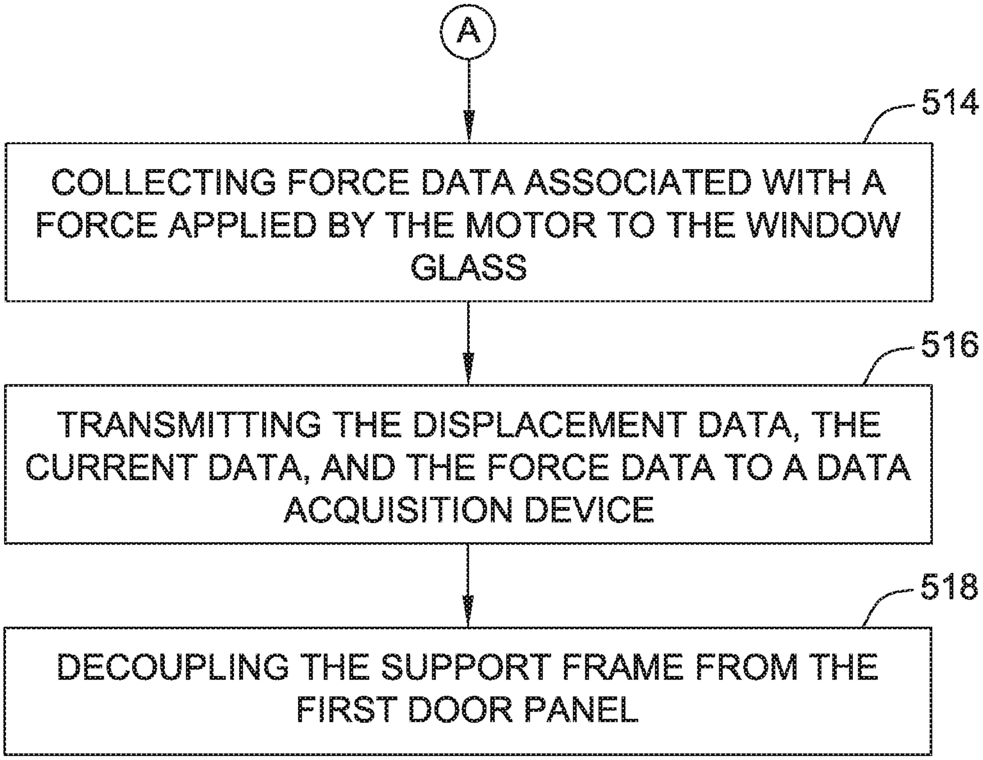
FIG. 5B is a continuation of the flow diagram shown in FIG. 5A.

FIGS. 5A and 5B (collectively referred to as "FIG. 5") are flow diagrams of an exemplary method 500 of measuring operational characteristics of a motorized window assembly using a measurement system, such as system 100 (shown in FIG. 1). In the exemplary embodiment, method 500 is performed on an automotive assembly line.

Method 500 is initiated with a measurement apparatus, such as measurement apparatus 200, being positioned 502 adjacent to a first door panel having a motorized window assembly and a door frame. The measurement apparatus may be moved or transported from one location of the automotive assembly line to another location, and positioned adjacent to the first door panel. A support frame of the measurement apparatus is coupled 504 to the first door. In at least some embodiments, a first fastening device of the support frame is coupled to the door panel and a second fastening device of the support frame is coupled to a window frame of the window assembly. A force sensor, or more specifically an engagement member of the force sensor, is positioned 506 within a window opening defined by the window frame such that the force sensor engages a top edge of the window glass when the window glass is moved towards a closed position. When properly positioned, the window glass causes the engaging member to move with the window glass. A current sensor of the measurement apparatus is electrically coupled 508 between a motor of the window assembly and a power supply.

The window assembly is tested by selectively activating the motor to move the window glass. During the testing, displacement data of the window glass is acquired or collected 510 by a displacement sensor coupled to the engaging member. In some embodiments, the displacement sensor is an elongated rod extending from a cylindrical housing that extends from, or retracts into, the housing based on movement of the window glass. Current data associated with the current supplied to the motor is acquired or collected 512 by the current sensor. In certain embodiments, the current sensor is a current shunt electrically coupled between the motor and the power supply to measure the current supplied to the motor. Force data associated with a force applied by the motor to the window glass is acquired or collected 514 by a force sensor coupled to the engaging member. The force sensor may be, for example, a load cell coupled to the engaging member.

The displacement data, the current data, and the force data (i.e., the measurement data) are transmitted 516 to a data acquisition system for analysis. In some embodiments, the measurement data is transmitted 516 continuously to the data acquisition system. In other embodiments, the measurement data is transmitted 516 to the data acquisition system asynchronously or periodically. After testing has been completed and the measurement data has been collected, the measurement apparatus support frame is decoupled 518 from the first door panel to enable the first door panel to transfer to another station on the automotive assembly line. The measurement apparatus, specifically the support frame, may then be positioned (i.e., moved) adjacent to a second door panel to repeat method 500 for the window assembly of the second door panel.

Figure 6:
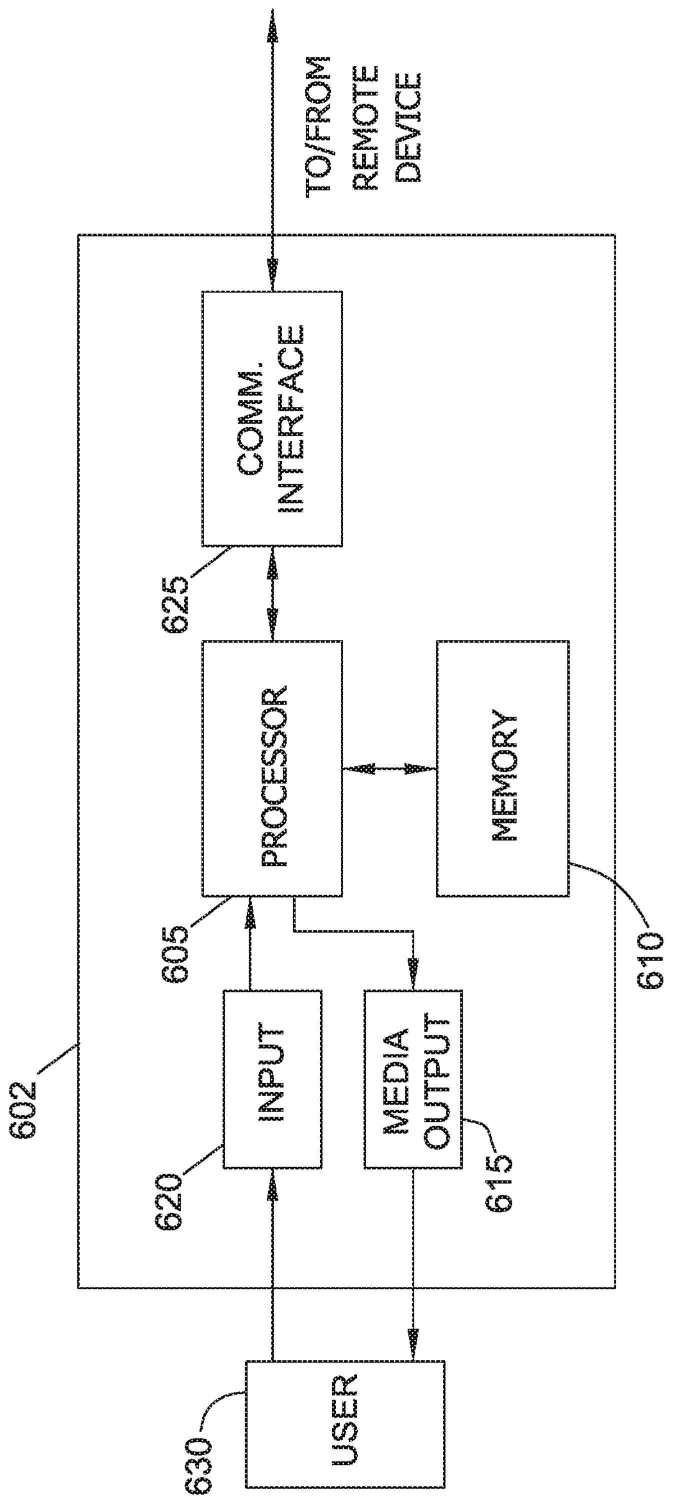
FIG. 6 is a block diagram of an exemplary computing device that may be used with the system shown in FIG. 1.

FIG. 6 depicts an exemplary configuration of a computing device 602 which may be included in data acquisition system 104 (shown in FIG. 1). Computing device 602 includes a processor 605 for executing instructions. In some embodiments, executable instructions may be stored in a memory area 610. Processor 605 may include one or more processing units (e.g., in a multi-core configuration). Memory area 610 may be any device allowing information such as executable instructions and/or other data to be stored and retrieved. Memory area 610 may include one or more computer-readable media.

Computing device 602 may also include at least one media output component 615 for presenting information to a user 630. Media output component 615 may be any component capable of conveying information to user 630. In some embodiments, media output component 615 may include an output adapter, such as a video adapter and/or an audio adapter. An output adapter may be operatively coupled to processor 605 and operatively coupleable to an output device such as a display device (e.g., a liquid crystal display (LCD), organic light emitting diode (OLED) display, cathode ray tube (CRT), or "electronic ink" display) or an audio output device (e.g., a speaker or headphones). In some embodiments, media output component 615 may be configured to present an interactive user interface to user 630. In the exemplary embodiment, media output component 615 presents measurement data of operational characteristics to user 630 for analysis. In one example, the displacement data, current data, and force data are graphically displayed on media output component 615 simultaneously and are synchronized with respect to time such that relationships between the measurement data are identifiable by user 630.

In some embodiments, computing device 602 may include an input device 620 for receiving input from user 630. Input device 620 may include, for example, a keyboard, a pointing device, a mouse, a stylus, a touch sensitive panel (e.g., a touch pad or a touch screen), a camera, a gyroscope, an accelerometer, a position detector, and/or an audio input device. A single component such as a touch screen may function as both an output device of media output component 615 and input device 620.

Computing device 602 may also include a communication interface 625, which may be communicatively coupleable to a remote device. Communication interface 625 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Figure 7:
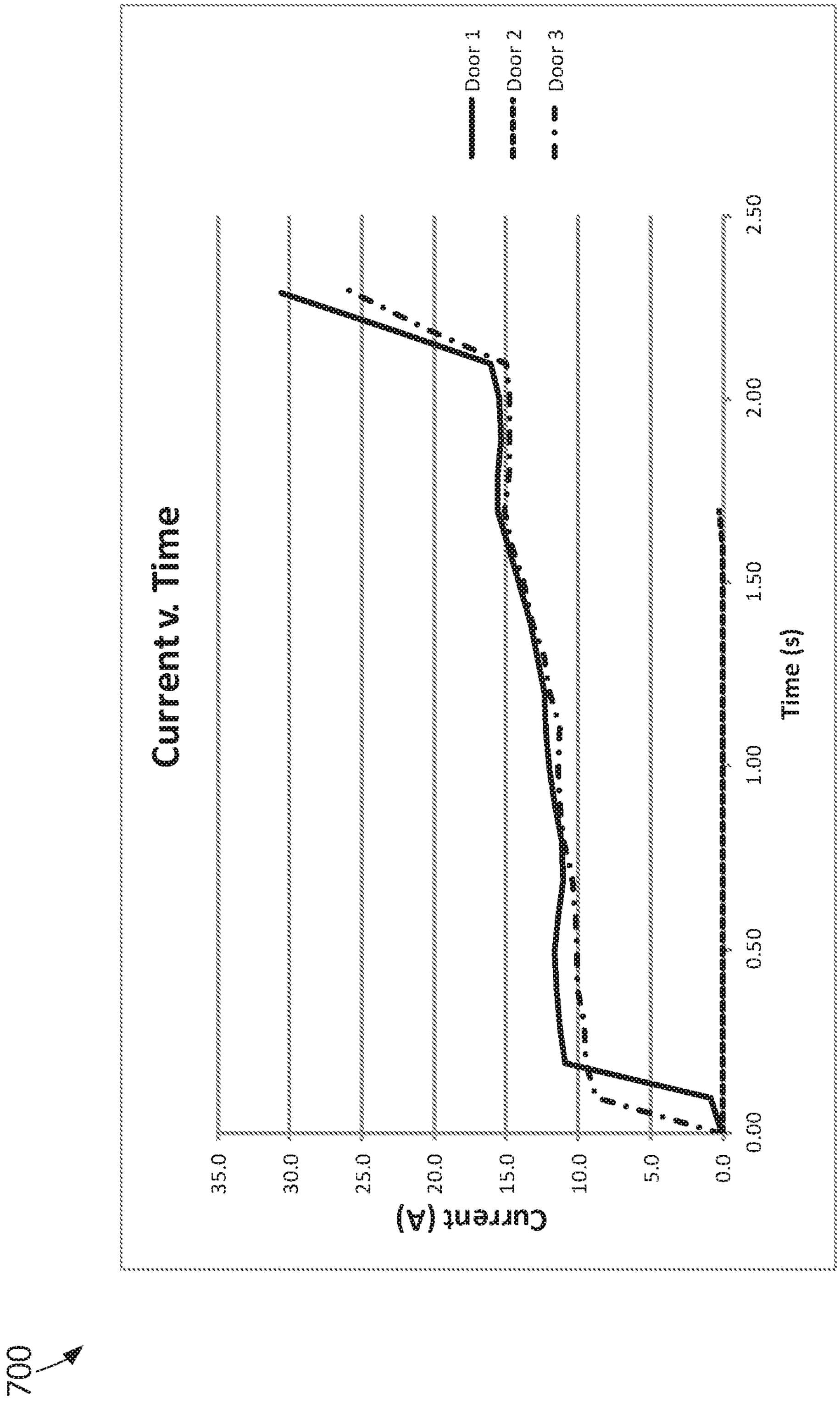
FIG. 7 is an exemplary electric current graph that may be displayed by the system shown in FIG. 1.
Figure 8:
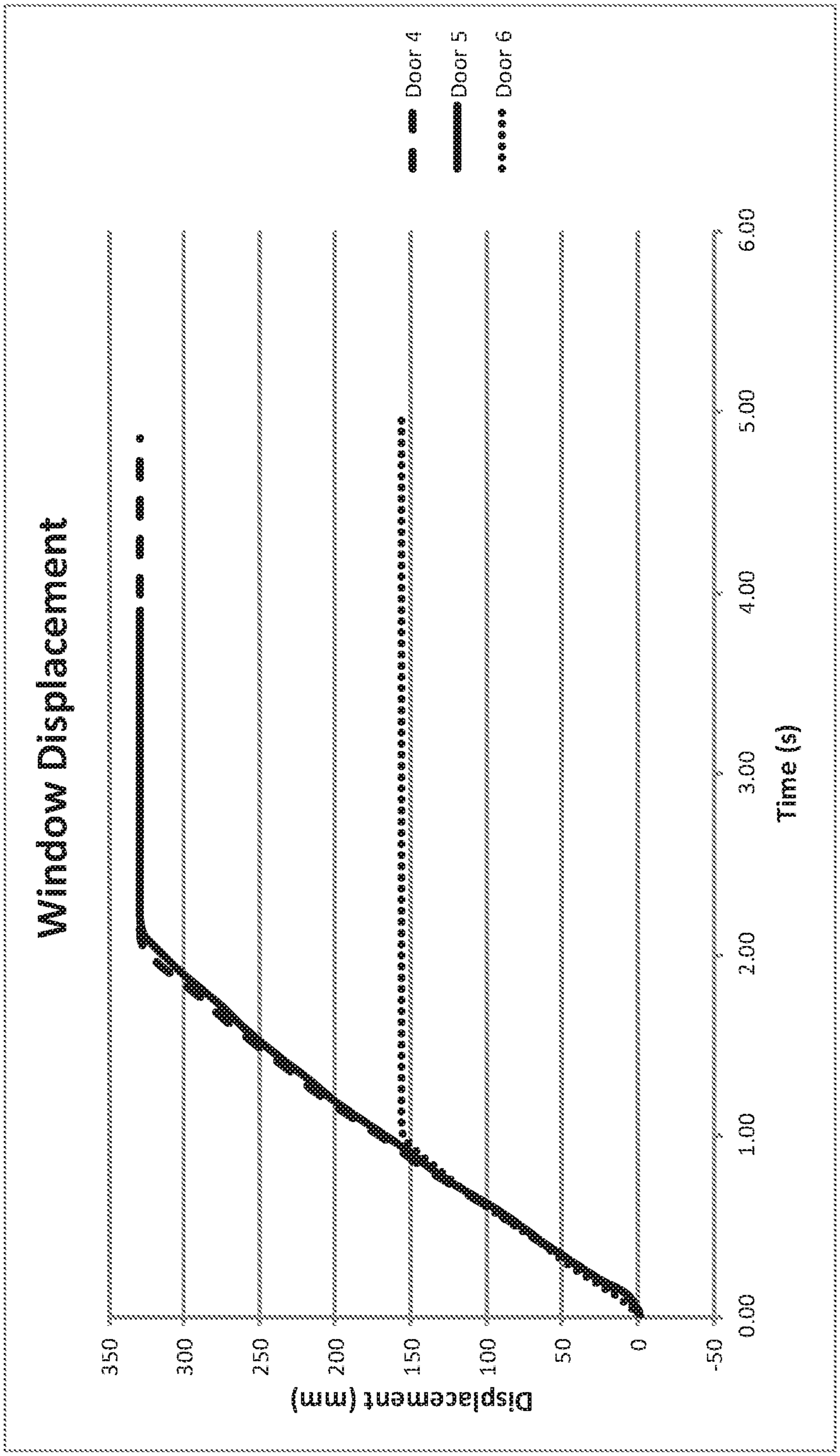
FIG. 8 is an exemplary window displacement graph that may be displayed by the system shown in FIG. 1.
Figure 9:
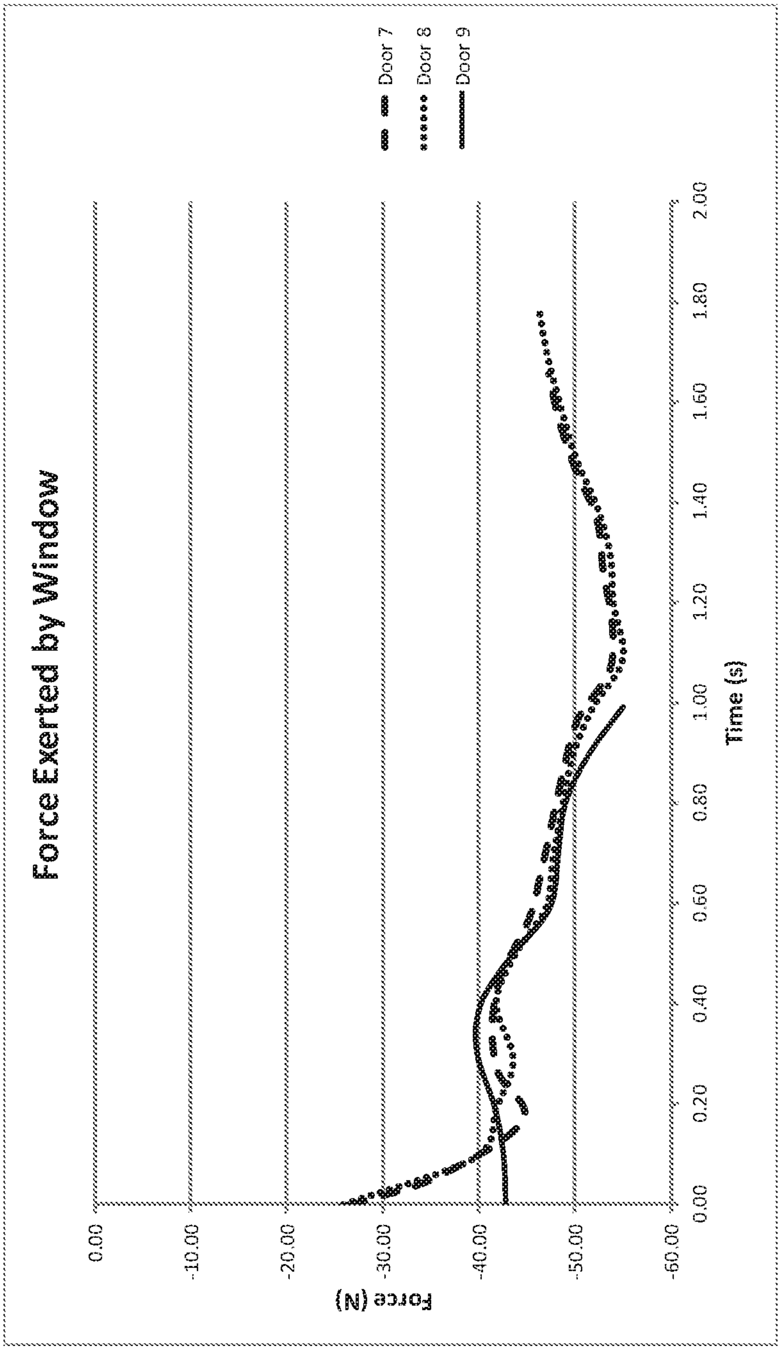
FIG. 9 is an exemplary force graph that may be displayed by the system shown in FIG. 1.

FIGS. 7-9 are exemplary graphs that may be generated based on the data collected by measurement system 100 (shown in FIG. 1) for analysis. More specifically, FIG. 7 is a graph 700 of the electric current measured for three door panel assemblies (i.e., door panel 5 and window assembly 10, shown in FIG. 1), FIG. 8 is a graph 800 of the window displacement for three door panel assemblies, and FIG. 9 is a graph 900 of the force exerted by windows of three door panel assemblies. In at least some embodiments, graphs 700, 800, 900 are displayed by data acquisition system 104 (shown in FIG. 1) for a user to analyze the measured data and identify any potential issues with the door panel assemblies based on the displayed data. The door panel assemblies in each graph 700, 800, 900 are different from the other door panel assemblies of the other graphs. In the exemplary embodiment, graphs 700, 800, 900 are line graphs. In other embodiments, graphs 700, 800, and/or 900 are in a different format suitable to display the measured data. In at least some embodiments, the measured data from system 100 is displayed based on user input. That is, a user can adjust the format of the displayed data to facilitate analysis.

With reference to FIG. 7, graph 700 represents measured current data from an upstroke of three door panel assemblies ("Doors" 1-3). Door 1 and Door 3 have similar curve characteristics, such as an initial steep increase in current to approximately 10 amperes (A), a gradual increase in current to approximately 15 A, and a steep increase at 15 A. Unlike the current data of Door 1 and Door 3, the current data of Door 2 remains at substantially 0 A. This data may indicate that the motor and/or power supply of Door 2 may be faulty, the motor may be disconnected from the power supply, and/or other issues associated with the measured current may have occurred. When analyzing graph 700 using data acquisition system 104, a user can identify the Door 2 assembly as faulty and remove it from an assembly line for inspection and/or repair.

With reference to FIG. 8, graph 800 represents measured displacement data from an upstroke of three door panel assemblies ("Doors" 4-6). The displacement data for Doors 4 and 5 have similar curve characteristics, such as starting at approximately 0 millimeters (mm) and increasing to approximately 330 mm in the closed position. The displacement data for Door 6 begins similar to Doors 4 and 5, but does not exceed approximately 156 mm. When analyzing the data, a user may check the travel path of the window at approximately 156 mm to determine if the window is blocked from advancing further on the path.

With reference to FIG. 9, graph 900 represents measured force data for an upstroke of three door panel assemblies ("Doors" 7-9). The force data of graph 900 include negative values. In other embodiments, the force data may be provided as positive values. The force data of Doors 7 and 8 have similar curve characteristics. The force data of Door 9 has different curve characteristics in comparison to Doors 7 and 8, which may indicate potential defects and other issues with Door 3. In one example, the force data of Door 9 may indicate that the motor of the door panel assembly is malfunctioning.

In at least some embodiments, for each door panel assembly measured by system 100, graphs 700, 800, 900 are provided to a user to enable the user to identify and at least partially diagnose any issues with the measured door panel assembly. Graphs 700, 800, 900 are displayable individually or together. In some embodiments, the data displayed by graphs 700, 800, 900 is synchronized with respect to time to enable the user to analyze the relationship of current, displacement, and force data at a particular time. In certain embodiments, the current, displacement, and force data may be displayed in a single graph to facilitate analysis of the relationships between the data over time. In one example, the current data is analyzed to identify potential issues with the door panel assembly. If a potential issue is identified, the current, displacement, and force data are displayed in time-synchronized graphs with the current data to determine one or more potential causes of the issue. The potential issues and the corresponding causes are stored by data acquisition system 104 to facilitate repair of the door panel assembly and/or to facilitate adjustments in the manufacturing process of the door panel assemblies to limit the potential issues.

Embodiments of the measurement systems for motorized window assemblies and methods described herein facilitate reducing the amount of measurement time necessary for measuring operational characteristics of motorized window assemblies. Moreover, measurement systems of the present disclosure facilitate improving the identification of abnormalities in window assemblies on automotive assembly lines, and as such, reduce the amount of defective, uncalibrated, misaligned, and/or otherwise malfunctioning parts associated with window assemblies for assembled vehicles. As compared to known measurement apparatuses, the measurement apparatus described herein facilitates measuring of operational characteristics of motorized window assemblies on an automotive assembly line. In particular, the measurement apparatus described herein includes a plurality of sensors coupled to a common support frame that is removably coupleable to door panels via one or more fastening devices. Moreover, embodiments of the support frame are relatively compact and/or lightweight as compared to other measurement apparatus, thereby making the support frame and measurement apparatus moveable or transportable between multiple door panels on a vehicle assembly line.

Exemplary embodiments of measurement systems for motorized window assemblies and methods of measuring the window assemblies are described herein. The systems and methods are not limited to the specific embodiments described herein, but rather, components of the systems and/or steps of the methods may be utilized independently and separately from other components and/or steps described herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An apparatus for use in measuring operational characteristics of a motorized window assembly coupled to a vehicle door panel, the window assembly including a motor and a window, said apparatus comprising:

a support frame comprising a first fastening device for use in coupling said support frame to the door panel, and a second fastening device for use in coupling to an upper portion of a window frame of the door panel;

a first sensor coupled to said frame for use in measuring displacement of the window;

a second sensor configured to be electrically coupled between the motor of the window assembly and a power supply, said second sensor for use in measuring an amount of current supplied to the motor; and a third sensor coupled to said frame and for use in measuring a force applied to the window by the motor;

wherein said support frame is removably coupleable to the door panel via said first and second fastening devices.

2. The apparatus of claim 1, wherein said first fastening device comprises a magnet configured for magnetic coupling to the door panel.

3. The apparatus of claim 1, wherein said first fastening device comprises at least one pin sized and shaped to be received within a fastener opening in the door panel.

4. The apparatus of claim 1, wherein said second fastening device comprises a hook defining a notch sized and shaped to receive the upper portion of the window frame therein.

5. The apparatus of claim 4, wherein said hook comprises a base and a leg extending upward from said base such that said base is configured to engage a lower surface of the window frame.

6. The apparatus of claim 1, wherein said second fastening device is removably coupled to said support frame.

7. The apparatus of claim 1, further comprising a support plate slidably coupled to said support frame, said support plate configured for linear displacement relative to said support frame in response to linear displacement of the window.

8. The apparatus of claim 7, wherein said third sensor is coupled to said support plate and comprises an engagement member for engaging a top edge of the window.

9. The apparatus of claim 7, wherein said first sensor comprises an elongate rod extending from a housing, wherein said elongate rod is operatively coupled to said support plate and configured to extend from and retract into the housing in response to linear displacement of the window.

10. The apparatus of claim 1, wherein said support frame is constructed of aluminum.

11. A measurement system for measuring operational characteristics of a motorized window assembly coupled to a vehicle door panel, the window assembly including a motor and a window, said system comprising:

a computing device; and a measurement apparatus comprising a support frame and a plurality of sensors communicatively coupled to said computing device, said plurality of sensors comprising a first sensor coupled to said frame and configured to measure displacement of the window, a second sensor configured to measure an amount of current supplied to the motor, and a third sensor coupled to said frame and configured to measure a force applied to the window by the motor;

wherein said support frame comprises a first fastening device for coupling said frame to the door panel, and a second fastening device configured for coupling to an upper portion of a window frame of the door panel, wherein said support frame is removably coupleable to the door panel via said first and second fastening devices.

12. The system of claim 11, wherein said computing device is configured to receive data from said plurality of sensors associated with operating characteristics of the motorized window assembly, said computing device configured to graphically display, on a display device, said data as a function of time to facilitate identifying abnormalities in the motorized window assembly.

13. The system of claim 11, wherein said first fastening device comprises a magnet configured for magnetic coupling to the door panel and at least one pin sized and shaped to be received within a fastener opening on the door panel.

14. The system of claim 11, wherein said second fastening device comprises a hook defining a notch sized and shaped to receive the upper portion of the window frame therein.

15. A method comprising:

positioning a measurement apparatus adjacent to a door panel including a motorized window assembly and a window frame, the motorized window assembly including a window and a motor, the measurement apparatus including a support frame, a first sensor connected to the support frame and configured to measure displacement of the window, a second sensor configured to measure an amount of current supplied to the motor, and a third sensor connected to the support frame and configured to measure a force applied to the window by the motor; and coupling the support frame to the door panel by coupling a first fastening device of the support frame to the door panel and coupling a second fastening device of the support frame to an upper portion of the window frame.

16. The method of claim 15, wherein the door panel is a first door panel, said method further comprising:

decoupling the support frame from the first door panel;
moving the support frame adjacent to a second door panel; and
coupling the support frame to the second door panel by coupling the first fastening device to the second door panel and coupling the second fastening device to an upper portion of the window frame.

17. The method of claim 15, wherein the first fastening device includes a magnet, and wherein coupling the support frame to the door panel comprises magnetically coupling the support frame to the door panel.

18. The method of claim 15, wherein the first fastening device includes at least one pin, and wherein coupling the support frame to the door panel comprises inserting the at least one pin into a fastener opening defined by the door panel.

19. The method of claim 15, wherein the second fastening device includes a hook defining a notch, and wherein coupling the support frame to the door panel includes inserting the upper portion of the window frame into the notch such that the hook engages a lower surface of the window frame.

20. The method of claim 15, further comprising positioning the third sensor within a window opening defined by the window frame such that the third sensor engages a top edge of the window when the window is moved towards a closed position.

* * * * *